United States Patent
Kohli et al.

(10) Patent No.: US 7,163,878 B2
(45) Date of Patent: Jan. 16, 2007

(54) ULTRA-SHALLOW ARSENIC JUNCTION FORMATION IN SILICON GERMANIUM

(75) Inventors: Puneet Kohli, Austin, TX (US); Mark Rodder, University Park, TX (US); Rick Wise, Fairview, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/267,413

(22) Filed: Nov. 4, 2005

(65) Prior Publication Data

US 2006/0105518 A1    May 18, 2006

Related U.S. Application Data

(60) Provisional application No. 60/627,447, filed on Nov. 12, 2004.

(51) Int. Cl.
*H01L 21/265* (2006.01)

(52) U.S. Cl. ............................ 438/520; 257/E21.343

(58) Field of Classification Search ........... 438/520, 438/522
See application file for complete search history.

(56) References Cited

U.S. PATENT DOCUMENTS

| | | | | |
|---|---|---|---|---|
| 5,646,425 | A * | 7/1997 | Beach | 257/102 |
| 6,069,062 | A * | 5/2000 | Downey | 438/528 |
| 6,875,674 | B1 * | 4/2005 | Asami et al. | 438/482 |
| 6,927,140 | B1 * | 8/2005 | Soman et al. | 438/309 |
| 7,018,880 | B1 * | 3/2006 | Hao et al. | 438/197 |
| 2002/0058385 | A1 * | 5/2002 | Noda | 438/305 |
| 2004/0115892 | A1 * | 6/2004 | Robertson | 438/305 |

* cited by examiner

*Primary Examiner*—W. David Coleman
(74) *Attorney, Agent, or Firm*—Peter K. McLarty; W. James Brady, III; Frederick J. Telecky, Jr.

(57) ABSTRACT

In one aspect, the present invention provides a method of forming junctions in a silicon-germanium layer (20). In this particular embodiment, the method comprises implanting a dopant (80) into the silicon-germanium layer (20) and implanting fluorine (70) into the silicon-germanium layer (20).

18 Claims, 4 Drawing Sheets

ULTRA-SHALLOW ARSENIC JUNCTION FORMATION IN SILICON GERMANIUM

CROSS-REFERENCE TO PROVISIONAL APPLICATION

This application claims the benefit of U.S. Provisional Application No. 60/627,447 entitled "ULTRA-SHALLOW ARSENIC JUNCTION FORMATION 1N SILICON GERMANIUM" to Puneet Kohli, et al., filed on Nov. 12, 2004 which is commonly assigned with the present invention and incorporated herein by reference as if reproduced herein in its entirety.

TECHNICAL FIELD OF THE INVENTION

This invention relates generally to the field of electronic devices and more particularly to a method of fabricating an ultra-shallow arsenic junction in silicon germanium.

BACKGROUND OF THE INVENTION

Silicon germanium (SiGe) is finding increasing usage in integrated circuits as a means to obtain improved MOS transistor performance. It has been found that MOS transistors fabricated in SiGe exhibit higher channel mobility compared to similar MOS transistors formed in silicon. As in the case of silicon, MOS transistors formed in SiGe should comprise ultra-shallow drain extension regions for improved transistor performance. It has been found that diffusion coefficient of arsenic in SiGe is about 7 to 10 times the arsenic diffusion coefficient in silicon. Therefore existing methods for forming ultra-shallow arsenic junctions in silicon will not form similar ultra-shallow arsenic junctions in SiGe. There is therefore a need for a method to form ultra-shallow arsenic junctions in SiGe. The instant invention addresses this need.

SUMMARY OF THE INVENTION

To overcome the deficiencies of the prior art, the present invention, in one embodiment, provides a method of forming junctions in a silicon-germanium layer. In this particular embodiment, the method comprises implanting a dopant into the silicon-germanium layer and implanting fluorine into the silicon-germanium layer.

In yet another embodiment, the present invention provides a method of manufacturing an integrated circuit. In this embodiment, the method comprises forming transistor gates over a semiconductor substrate. A dopant is implanted into a silicon-germanium layer located over the semiconductor substrate and adjacent the transistor gates. Fluorine is also implanted into the silicon-germanium layer and adjacent the transistor gates. Source and drains are formed adjacent the transistor gates and dielectric layers are deposited over the transistor gates. Interconnects are formed in the dielectric layers to electrically interconnect the transistors and form an operative integrated circuit.

The foregoing has outlined preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the present invention. Those skilled in the pertinent art should also realize that such equivalent constructions do not depart from the spirit and scope of the invention.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION

FIGS. 1 through 5 illustrates various aspects of the fabrication of MOS transistors in integrated circuits. As described in greater detail below, the method of the instant invention can be used to fabricate ultra-shallow arsenic regions in SiGe.

Figure 1:
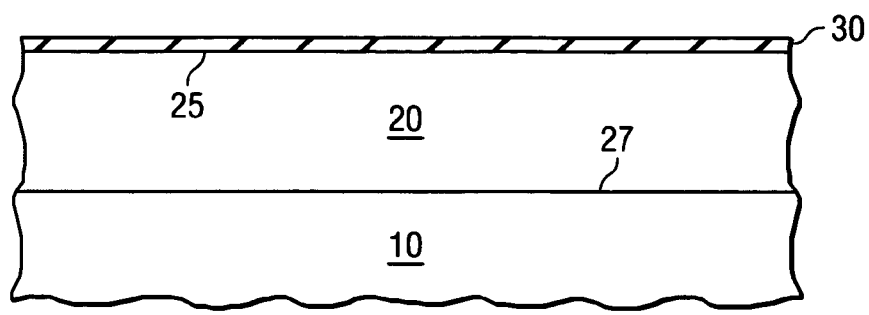
FIG. 1 is a cross-sectional diagram of a silicon substrate and a SiGe epitaxial layer according to an embodiment of the instant invention.

A SiGe expiatxial layer 20 is formed on a semiconductor substrate 10 as shown in FIG. 1. The SiGe layer can be formed using known methods for forming such layers. In an embodiment, the germanium (Ge) concentration in the SiGe layer 20 will vary from 0 atomic percent at the interface 27 between the semiconductor substrate 10 and the SiGe layer 20 to about 20 atomic percent at upper surface 25 of the layer 20. The SiGe layer 20 can be any thickness that results in sufficient strain in the layer 20 to improve the performance of MOS transistors that will be subsequently formed in the layer 20 and optional layer 30. In an embodiment, the SiGe layer will be approximately 4 μm to 7 μm thick with the Ge concentration varying from 0 atomic percent to about 20 atomic percent over a portion of the layer 20 within 1.5 μm to 2 μm of the interface 27 with the semiconductor substrate 10, and remaining approximately constant at about 20 atomic percent within 2.5 μm to 5 μm of the upper surface 25 of the SiGe layer 20. Following the formation of the SiGe layer 20, an optional silicon layer 30 can be formed on the SiGe layer 20 as shown in FIG. 1.

Figure 2:
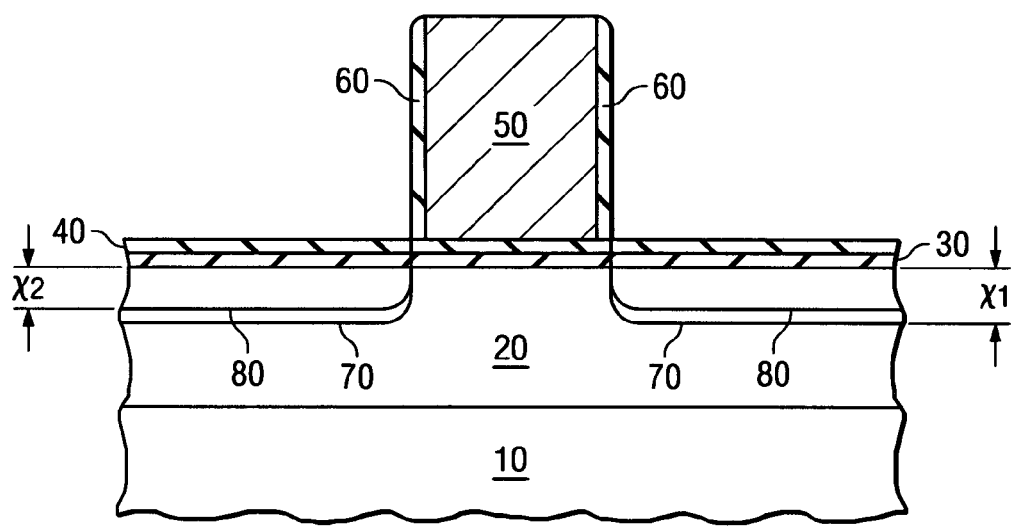
FIG. 2 is a cross-sectional diagram showing the formation of ultra shallow drain extension regions in SiGe according to an embodiment of the instant invention.

Shown in FIG. 2 is a partially completed MOS transistor formed on the structure shown in FIG. 1. A transistor dielectric layer 40 is formed on the optional silicon layer 30, if present, as shown in the Figure. In embodiments where the optional silicon layer 30 is not present, the transistor dielectric layer 40 will be formed directly on the SiGe layer 20. The transistor dielectric layer 40 can comprise any suitable dielectric material formed using known methods, such as thermal oxidation, chemical vapor deposition (CVD), and various plasma processes. In various embodiments, the transistor dielectric layer 40 can comprise, silicon oxide, silicon oxynitride, silicon nitride, hafnium, hafnium oxide, hafnium oxynitride, hafnium silicates, various combinations of these materials, or any other suitable dielectric material.

Following the formation of the transistor dielectric layer 40, a transistor gate 50 is formed over the transistor dielectric layer 40. The transistor gate can be formed using conductive materials, such as doped polycrystalline silicon (polysilicon), metals, metal silicides, or any other suitable material. In an embodiment, a blanket polysilicon layer is formed over the transistor dielectric layer 40. A patterned photoresist layer is then formed over the blanket polysilicon layer and used as an etch mask during the subsequent etch process used to define the transistor gate 50. Following the formation of the transistor gate 50, spacer layers 60 are formed adjacent the transistor gate 50 as shown in FIG. 2. The spacer layers 60 can comprise silicon oxide, silicon oxynitride, silicon nitride, various combinations of these materials, or any other suitable material.

Following the formation of the spacer layers, drain extension regions are formed in the SiGe layer 20. In the embodiment shown in FIG. 2, the drain extension regions will be formed by implanting arsenic and fluorine into the SiGe layer 20. As described earlier, the diffusion coefficient of arsenic in SiGe is about 7–10 times that of the arsenic diffusion coefficient in silicon, and the implantation of the fluorine species is necessary to retard the diffusion of As in SiGe. The order of the implantation may vary. For example, the fluorine species may be implanted first followed by the implantation of the arsenic species, or arsenic may be implanted first followed by the implantation of the fluorine species. Shown in FIG. 2 are the peak concentrations of the fluorine 70 and arsenic 80 implanted species prior to any thermal annealing. As shown in the Figure, the depth of the fluorine peak concentration $X_1$ is greater than (or equal to) the depth of the arsenic peak concentration $X_2$. This condition enhances the effectiveness of the implanted fluorine species in retarding the diffusion of the arsenic species. In an embodiment, the fluorine species are implanted at doses of $1\times10^{15}$ cm$^{-2}$ to $1\times10^{16}$ cm$^{-2}$ for arsenic implanted doses of $8\times10^{14}$ cm$^{-2}$ to $1\times10^{16}$ cm$^{-2}$. Following the implantation of the arsenic and fluorine species, additional dopant species can be implanted into the SiGe layer.

Figure 2A:
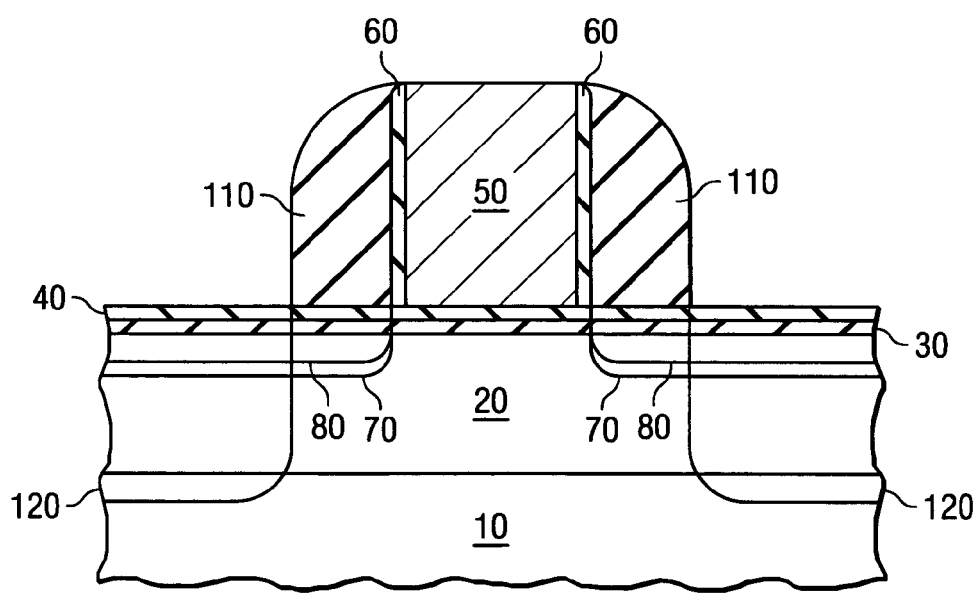
FIG. 2(a) is a cross-sectional diagram showing a MOS transistor formed according to an embodiment of the instant invention.

Following the formation of the drain extension regions 80 shown in FIG. 2, the MOS transistor can be completed as shown in FIG. 2(a). Sidewall structures 110 are formed against the transistor gate 50 as shown in the Figure. In an embodiment, the sidewall structures 110 are formed using silicon oxide, silicon nitride, silicon oxynitride, silicon carbide, or any other suitable dielectric material. The sidewall structures 110 can also comprise any number of layers formed using suitable dielectric material, such as silicon oxide, silicon nitride, silicon oxynitride, silicon carbide, or any other suitable dielectric material. The sidewall structures 110 can be formed using a self-aligned process where blanket layers of dielectric material are anisotropically etched to form the desired structures 110. Following the formation of the sidewall structures 110, the source and drain regions 120 are formed by implanting n-type dopant species into the SiGe layer 20 and the underlying semiconductor substrate 10. Thermal annealing is then performed to activate the implanted dopant species. During the thermal annealing, the implanted fluorine species will retard and/or inhibit the diffusion of the arsenic species in the SiGe layer 20.

Figure 2B:
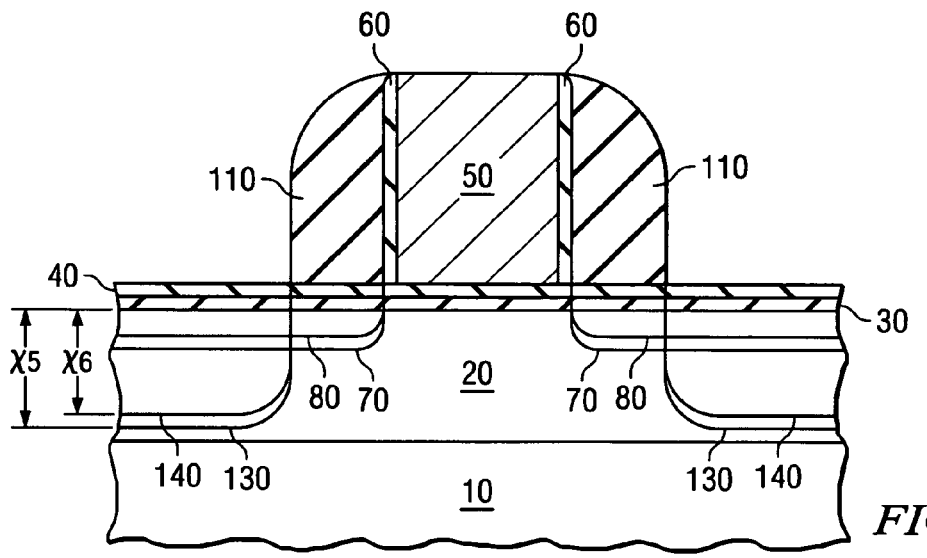
FIG. 2(b) is a cross-sectional diagram showing a MOS transistor formed according to another embodiment of the instant invention.

In some instances, it may be desirable to form shallow source and drain regions. Such an embodiment is shown in FIG. 2(b) where the peak concentration of fluorine 130 is implanted to a depth $x_5$ that is greater than or equal to the depth $x_6$ of the peak concentration of arsenic 140 that is used in this embodiment to form the source and drain regions. In an embodiment, the fluorine species are implanted at doses of $1\times10^{15}$ cm$^{-2}$ to $1\times10^{16}$ cm$^{-2}$ for arsenic implanted doses of $8\times10^{14}$ cm$^{-2}$ to $1\times10^{16}$ cm$^{-2}$.

Figure 3:
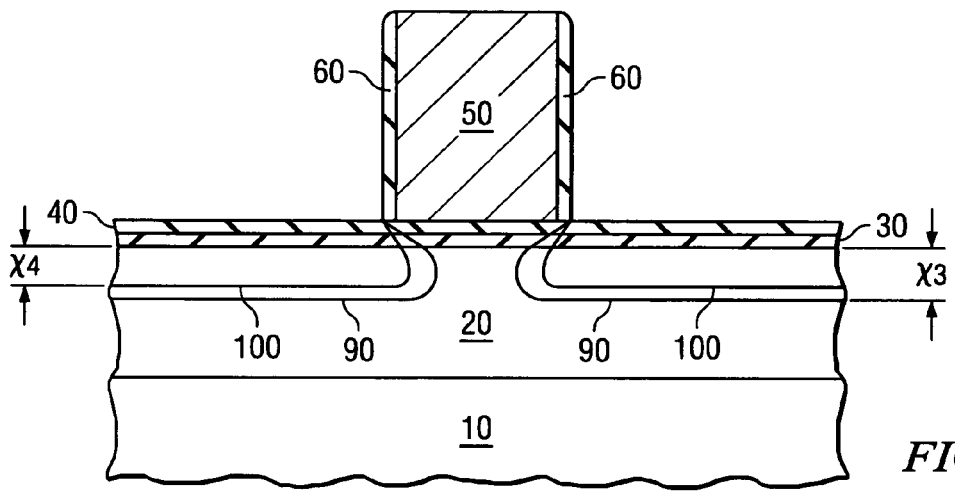
FIG. 3 is a cross-sectional diagram showing the formation of halo regions according to an embodiment of the instant invention.

A further embodiment of the instant invention is shown in FIG. 3. In this embodiment, the SiGe layer 20, the transistor gate 50, and the spacer layers 60 are formed as described previously. In forming PMOS transistors, halo or pocket implants are often used to limit the extent to which the depletion regions formed by the drain extension regions extend under the transistor gate 50. These pocket (halo) implants are specific implantation processes introduced for the purpose of limiting the encroachment of the drain extension regions. As such they should not be confused with the many other ion implantation processes used to fabricate the MOS transistor. Some of these other implantation processes include drain extension implants, source and drain implants, punch through implants, and threshold voltage adjust implants. As shown in FIG. 3, fluorine is implanted into the SiGe region 20 with a peak concentration 90 at a depth $X_3$ that is greater than or equal to the depth $x_4$ of the implanted peak arsenic concentration 100 that comprises the pocket (halo) implant. In an embodiment, the fluorine species are implanted at doses of $5\times10^{13}$ cm$^{-2}$ to $5\times10^{14}$ cm$^{-2}$ for arsenic implanted doses of $1\times10^{13}$ cm$^{-2}$ to $1\times10^{14}$ cm$^{-2}$. Following the formation of the pocket (halo) regions 100 and the fluorine regions 90, p-type source and drain regions 150 are formed by implanting p-type dopants into the SiGe layer 20 and/or the underlying semiconductor 10.

Figure 4:
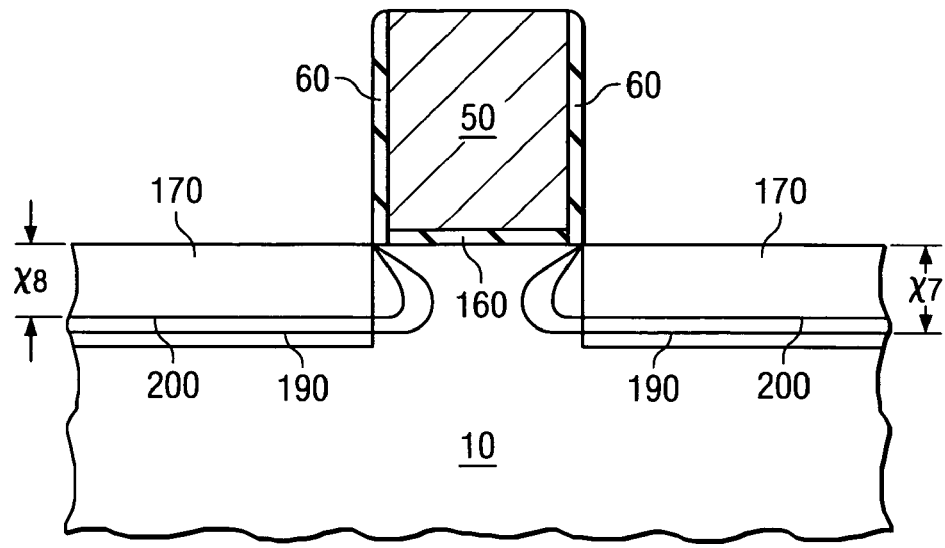
FIG. 4 is a cross-sectional diagram showing the formation of halo (pocket) regions in a SiGe epitaxial region according to an embodiment of the instant invention.

In some instances, it may be desirable to form SiGe regions adjacent to the transistor gate 50. Such an embodiment is shown in FIG. 4. As shown in FIG. 4, SiGe regions 170 are formed in the semiconductor 10 in regions adjacent to the transistor gate 50. In other embodiments, the SiGe regions can be formed adjacent to sidewall structures that are formed adjacent to the transistor gate 50. The SiGe regions 170 are formed using known methods for forming such regions. One such method comprises etching a portion of the semiconductor 10 and selectively forming SiGe in the etched portions of the semiconductor 10 using conventional selective epitaxial deposition processes, such as chemical vapor deposition.

Shown in FIG. 4, is the formation of arsenic pocket regions with a peak concentration 200 formed at a depth of $x_8$ in a transistor structure comprising SiGe regions 170 formed adjacent to the transistor gate 50. The peak concentration 190 of the accompanying fluorine implanted region is at a depth of $x_7$, where $X_7$ is greater than or equal to $x_8$. In an embodiment, the fluorine species are implanted at doses of $5\times10^{13}$ cm$^{-2}$ to $5\times10^{14}$ cm$^{-2}$ for arsenic implanted doses of $1\times10^{13}$ cm$^{-2}$ to $1\times10^{14}$ cm$^{-2}$.

Figure 5:
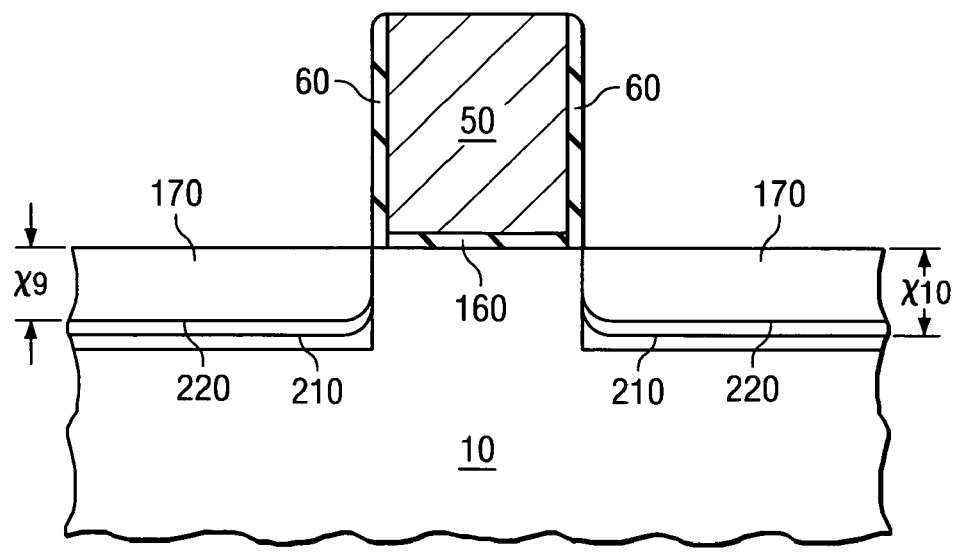
FIG. 5 is a cross-sectional diagram showing the formation of ultra shallow drain extension regions in a SiGe epitaxial region according to an embodiment of the instant invention.

Shown in FIG. 5 is the formation of arsenic drain extension regions with a peak concentration 220 formed at a depth of $x_9$ in a transistor structure comprising SiGe regions 170 formed adjacent to the transistor gate 50. The peak concentration 210 of the accompanying fluorine implanted region is at a depth of $x_{10}$, where $x_{10}$ is greater than or equal to $x_9$. In an embodiment, the fluorine species are implanted at doses of $1\times10^{15}$ cm$^{-2}$ to $1\times10^{16}$ cm$^{-2}$ for arsenic implanted doses of $8\times10^{14}$ cm$^{-2}$ to $1\times10^{16}$ cm$^{-2}$.

Figure 3A:
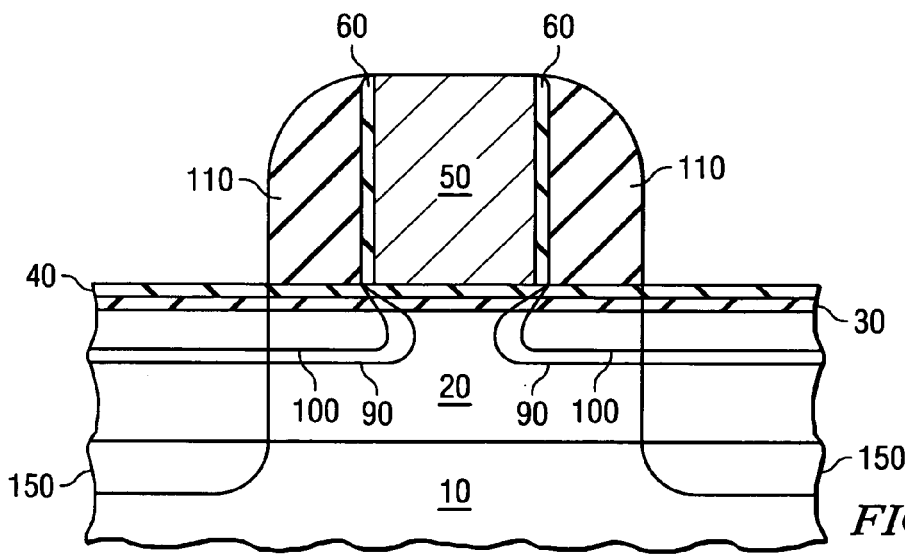
FIG. 3(a) is a cross-sectional diagram showing a MOS transistor formed according to an embodiment of the instant invention.
Figure 6:
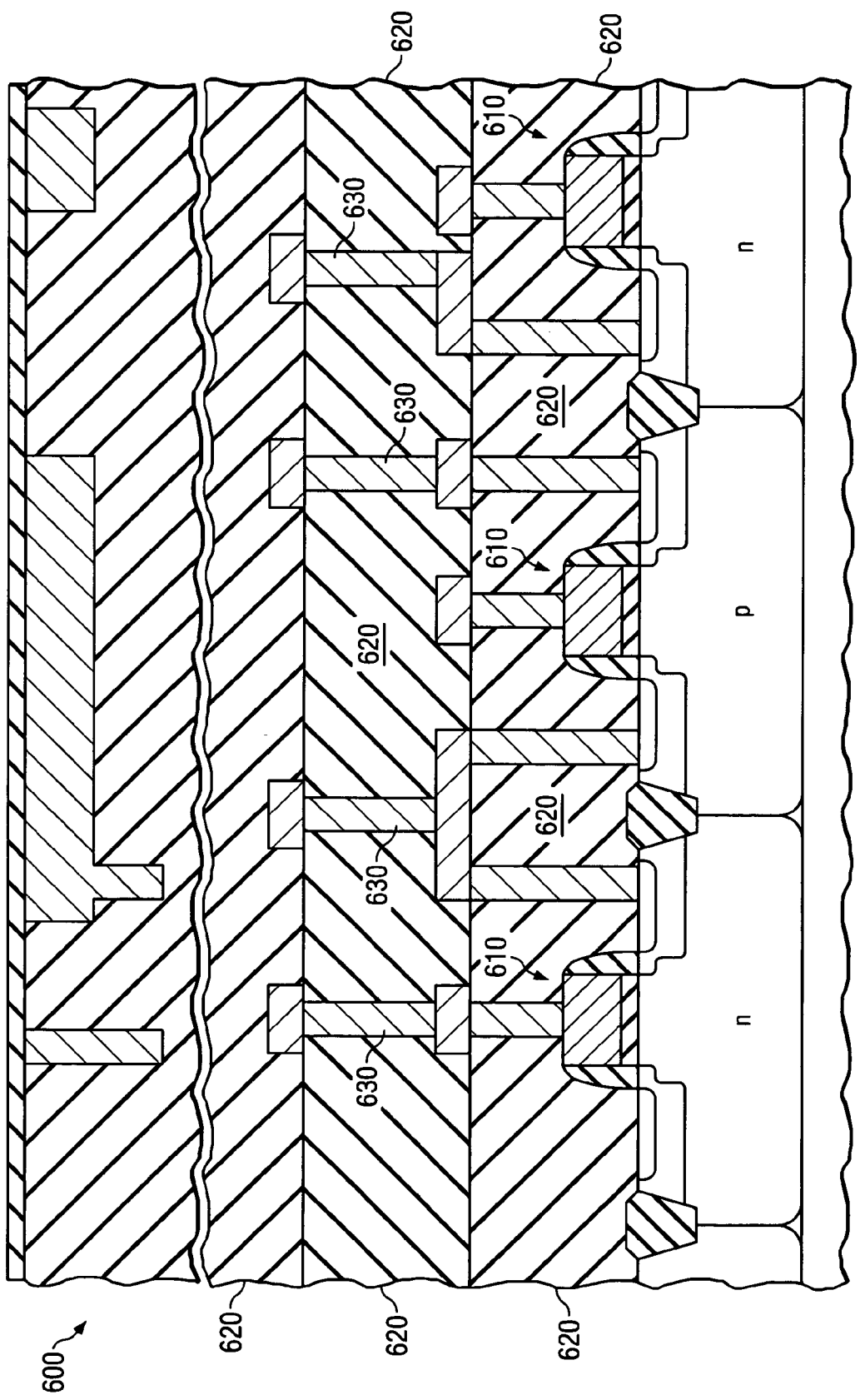
FIG. 6 is a cross-sectional view of an integrated circuit that can be manufactured using the principles of instant invention.

Turning now to FIG. 6, there is illustrated a schematic sectional view of an integrated circuit 600 that can be manufactured in accordance with the principles of the present invention. The IC 600 may include devices 610, such as the transistor shown above in FIGS. 2(a), 2(b), or 3(a), to form CMOS devices, BICMOS devices, Bipolar devices, as well as capacitors or other types of devices. The IC 600 may further include passive devices, such as inductors or resistors, or it may also include optical devices or optoelectronic devices, which are not shown here. Those skilled in the art are familiar with these various types of devices and their manufacture. In the particular embodiment illustrated in FIG. 6, the IC 600 includes the devices 610 having dielectric layers 620 located thereover. Additionally, interconnect structures 630 are located within the dielectric layers 620 to interconnect the various devices 610, thus, forming the operational integrated circuit 600.

Although the present invention has been described with several embodiments, various changes and modifications may be suggested to one skilled in the art. It is intended that the present invention encompass such changes and modifications that follow within the scope of the appended claims.

What is claimed is:

1. A method of forming junctions in a silicon-germanium layer, comprising:
   implanting a dopant into the silicon-germanium layer;
   implanting fluorine into the silicon-germanium layer; and
   wherein a depth of the fluorine peak concentration is greater than or equal to a depth of the dopant peak concentration.

2. The method recited in claim 1, wherein the dopant is arsenic.

3. The method recited in claim 1, wherein implanting the dopant and fluorine includes forming a drain extension region or shallow source and drain regions.

4. The method recited in claim 3, wherein an implant dose of the fluorine ranges from $1\times10^{15}$ cm$^{-2}$ to $1\times10^{16}$ cm$^{-2}$ for a dopant implant dose of $8\times10^{14}$ cm$^{-2}$ to $1\times10^{16}$ cm$^{-2}$.

5. The method recited in claim 1, wherein implanting the dopant and fluorine includes forming a halo or pocket region.

6. The method recited in claim 5, wherein an implant dose of the fluorine ranges from $5\times10^{13}$ cm$^{-2}$ to $5\times10^{14}$ cm$^{-2}$ for a dopant implant dose of $1\times10^{13}$ cm$^{-2}$ to $1\times10^{14}$ cm$^{-2}$.

7. The method recited in claim 1, wherein the dopant and fluorine are implanted adjacent a transistor gate.

8. The method recited in claim 1, wherein the silicon-germanium layer is located over a semiconductor substrate and the silicon-germanium layer has a germanium concentration that ranges from about 0 atomic percent at an interface between the semiconductor substrate and the silicon-germanium layer to about 20 atomic percent at an upper surface of the silicon-germanium layer.

9. The method recited in claim 1 further including conducting an anneal following the implantation of the dopant and the fluorine.

10. A method of manufacturing an integrated circuit, comprising, comprising:
    forming transistor gates over a semiconductor substrate;
    implanting a dopant into a silicon-germanium layer located over the semiconductor substrate and adjacent the transistor gates;
    implanting fluorine into the silicon-germanium layer adjacent the transistor gates;
    forming source and drains adjacent the transistor gates;
    depositing dielectric layers over the transistor gates;
    forming interconnects in the dielectric layers to electrically interconnect the transistors and form an operative integrated circuit; and
    wherein a depth of the fluorine peak concentration is greater than or equal to a depth of the dopant peak concentration.

11. The method recited in claim 10, wherein the dopant is arsenic.

12. The method recited in claim 10, wherein implanting the dopant and fluorine includes forming a drain extension region or shallow source and drain regions.

13. The method recited in claim 12, wherein an implant dose of the fluorine ranges from $1\times10^{15}$ cm$^{-2}$ to $1\times10^{16}$ cm$^{-2}$ for a dopant implant dose of $8\times10^{14}$ cm$^{-2}$ to $1\times10^{16}$ cm$^{-2}$.

14. The method recited in claim 10, wherein implanting the dopant and fluorine includes forming a halo or pocket region.

15. The method recited in claim 14, wherein an implant dose of the fluorine ranges from $5\times10^{13}$ cm$^{-2}$ to $5\times10^{14}$ cm$^{-2}$ for a dopant implant dose of $1\times10^{13}$ cm$^{-2}$ to $1\times10^{14}$ cm$^{-2}$.

16. The method recited in claim 10, wherein the dopant and fluorine are implanted adjacent a transistor gate.

17. The method recited in claim 10, wherein the silicon-germanium layer is located over a semiconductor substrate and the silicon-germanium layer has a germanium concentration that ranges from about 0 atomic percent at an interface between the semiconductor substrate and the silicon-germanium substrate to about 20 atomic percent at an upper surface of the silicon-germanium substrate.

18. The method recited in claim 10 further including conducting an anneal following the implantation of the dopant and the fluorine.

* * * * *